United States Patent
Krivokapic et al.

(10) Patent No.: US 6,975,014 B1
(45) Date of Patent: Dec. 13, 2005

(54) METHOD FOR MAKING AN ULTRA THIN FDSOI DEVICE WITH IMPROVED SHORT-CHANNEL PERFORMANCE

(75) Inventors: Zoran Krivokapic, Santa Clara, CA (US); Sunny Cherian, San Jose, CA (US); Allison Holbrook, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 427 days.

(21) Appl. No.: 09/826,634

(22) Filed: Apr. 5, 2001

Related U.S. Application Data

(60) Provisional application No. 60/260,484, filed on Jan. 9, 2001.

(51) Int. Cl.[7] .............................................. H01L 29/00
(52) U.S. Cl. ....................... 257/510; 257/509; 257/506
(58) Field of Search ................................ 438/199, 229, 438/230; 257/506, 510, 513, 509

(56) References Cited

U.S. PATENT DOCUMENTS

| 6,087,208 A * | 7/2000 | Krivokapic et al. ......... 438/183 |
| 6,319,807 B1 * | 11/2001 | Yeh et al. ................... 438/595 |

* cited by examiner

Primary Examiner—Bradley K. Smith
(74) Attorney, Agent, or Firm—Farjami & Farjami LLP

(57) ABSTRACT

A method for forming a FDSOI device with channel length less than 50 nm with good short channel control. The gate has a tapered polysilicon spacer and a dielectric spacer. A polysilicon gate feature is formed and dielectric sidewall spacers are formed thereon. The polysilicon gate feature is then etched to form tapered poly features separated by a gap. A gate dielectric is deposited at low temperature, then metal is deposited into the gap to form the metal gate.

7 Claims, 5 Drawing Sheets

METHOD FOR MAKING AN ULTRA THIN FDSOI DEVICE WITH IMPROVED SHORT-CHANNEL PERFORMANCE

CROSS-REFERENCE TO RELATED APPLICATION

This application is related to U.S. Provisional Application No. 60/260,484, filed on Jan. 9, 2001.

FIELD OF THE INVENTION

This invention relates to semiconductor device manufacturing methods, and in particular to methods for forming ultra-thin Silicon-On-Insulator (SOI) device structures.

BACKGROUND OF THE INVENTION

As integrated circuit dimensions decrease and circuit speed increases, new transistor structures have been developed in order to yield good performance at the smaller dimensions. In particular, Silicon-On-Insulator (SOI) devices are known and are generally undoped or very lightly doped silicon on a low K dielectric. SOI devices are characterized by having the active device region insulated from the bulk substrate, generally by a buried oxide layer. The active device region is thereby said to be floating. SOI devices have been developed which consume less power than do bulk CMOS devices, and which operate at higher speeds than do bulk CMOS devices. FIG. 1 shows a prior art SOI device, including bulk substrate 2, buried oxide layer 4, SOI silicon layer 6, field oxide regions 7, gate dielectric layer 8, conducting gate 10, gate sidewall spacers 11, doped source and drain regions 12, and channel region 14. Source and drain regions may overlap the gate region, or gate sidewall spacer technology may be used to provide separation, or underlap, between the gate and the source-drain regions.

For SOI devices having channel lengths below about 50 nm, in particular Fully Depleted Silicon On Insulator (FD-SOI) devices, it is very difficult to achieve good short-channel control, i.e., to effectively shut off the transistors in the off state, without significantly thinning down the thickness of the buried layer and the thickness of the SOI silicon layer, which is difficult to reliably achieve with available processes. For a device with SOI silicon thickness of less than 20 nm, an underlap of the source/drain regions with the gate is needed in order to be able to turn off the device. Accordingly, the details of the gate sidewall spacer technology used in the fabrication of such devices are critical to their performance. By way of example, it is known that if doped polysilicon spacers are used in place of nitride spacers (termed a "straddled gate device"), the device DC characteristics improve significantly. The polysilicon spacer which is also doped during source/drain implant serves as a side gate with a lower work function. It behaves like a longer gate when there is no bias applied on the gate (i.e., in the Ioff condition). The polysilicon side gate causes the surface beneath it to invert at much lower applied voltage than the voltage necessary to invert the main channel region, due to the lower work function of the polysilicon. This causes the device to behave like a very short channel device during Ion conditions. The result is a much improved Ion and Ioff. However, when single layer polysilicon gate sidewall spacers are used, the source/drain extension regions reach under the poly spacers and cause an increased overlap capacitance which slows down the AC device performance.

The formation of multiple sidewall spacers, including an inner polysilicon spacer and an outer oxide or nitride spacer, over a metal gate with CD's less than 50 nm, has not to the best knowledge of the inventors been achieved in the prior FDSOI art, but would achieve the desired DC and AC characteristics.

BRIEF SUMMARY OF THE INVENTION

It is therefore an object of this invention to provide a method for forming a Fully Depleted Silicon-On-Insulator device structure with a thin SOI silicon layer and a channel length less than 50 nm, which maintains excellent Ioff DC characteristics without degrading device AC speed and characteristics.

It is a further object of this invention to provide a method for forming a Fully Depleted Silicon-On-Insulator device structure with a thin SOI silicon layer and a channel length less than 50 nm which utilizes a tapered polysilicon etch to form inner polysilicon spacers and which utilizes deposited metal within the etched region.

DETAILED DESCRIPTION OF THE INVENTION

Figure 1:
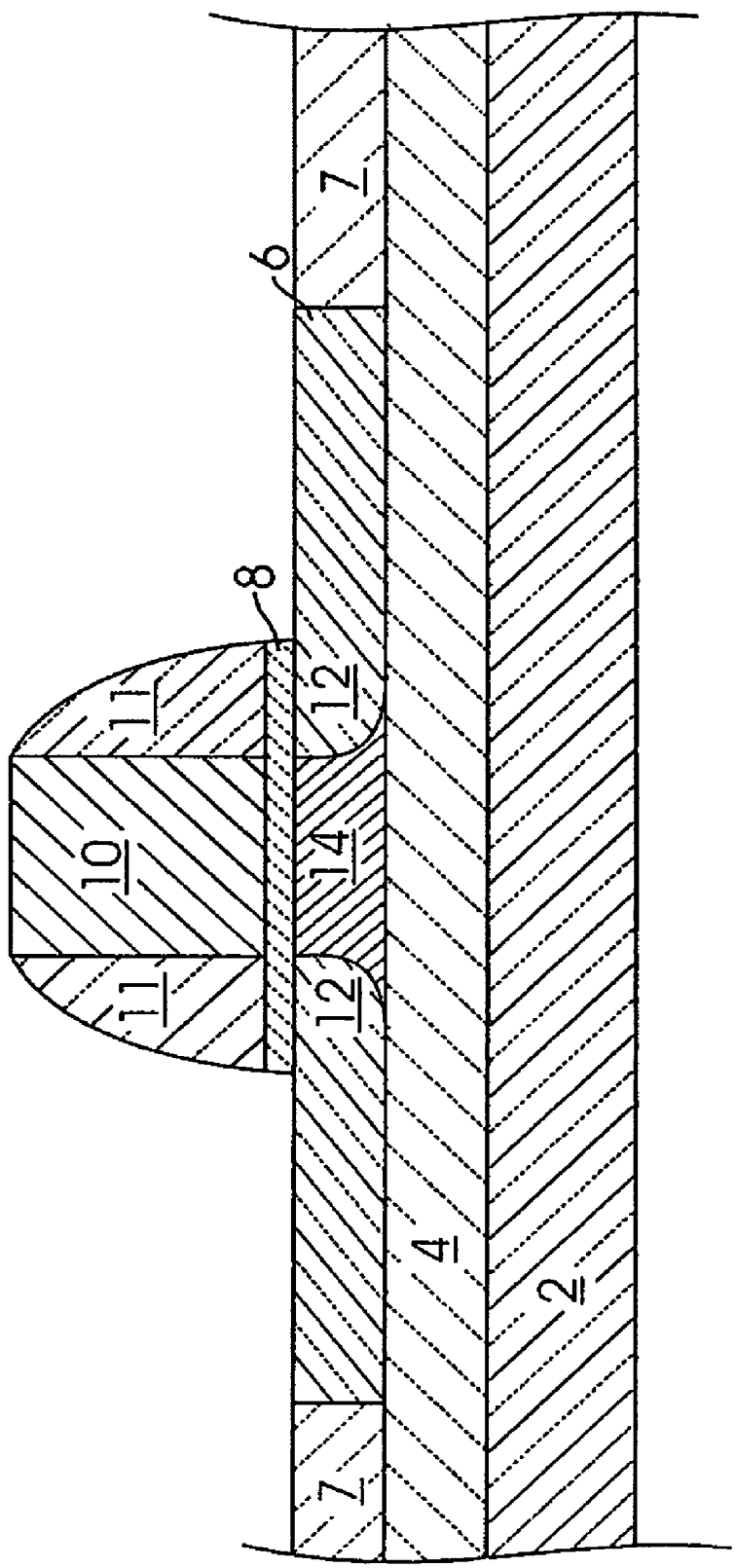
FIG. 1 shows a prior art SOI device structure.
Figure 2:
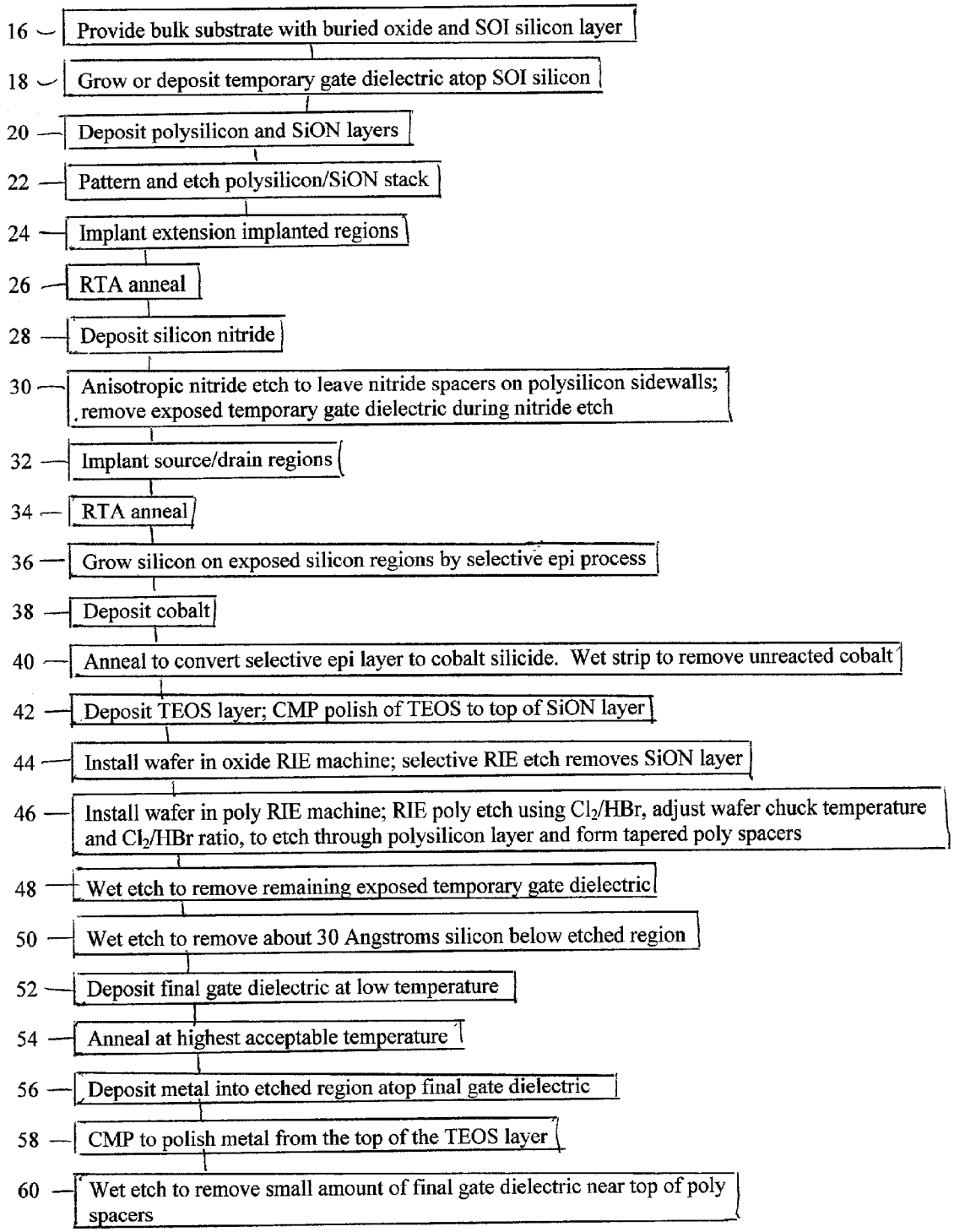
FIG. 2 shows a process flow for the inventive process.
Figure 3A:
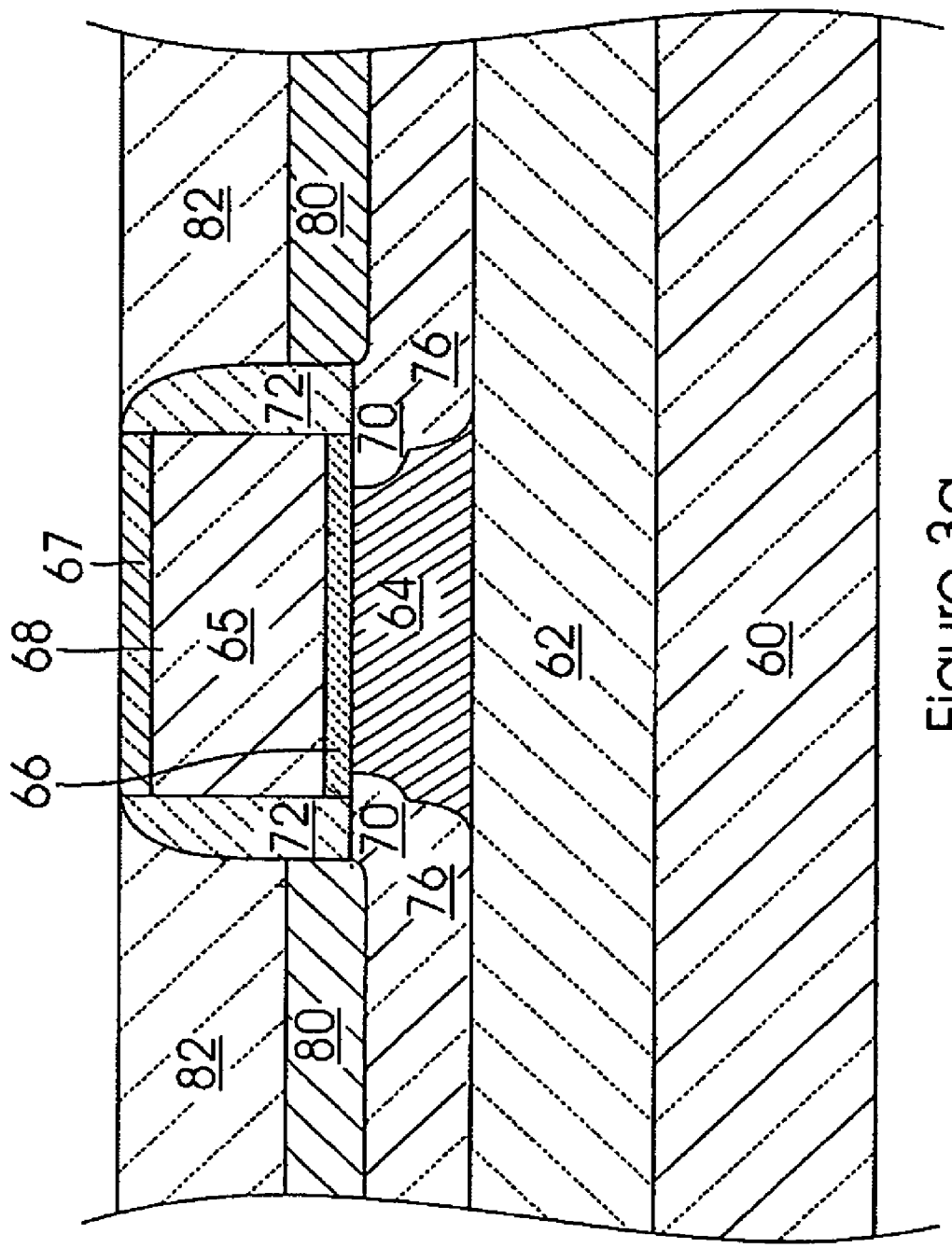
FIG. 3a illustrates an intermediate structure following formation of a MOS SOI structure after step 42.
Figure 3B:
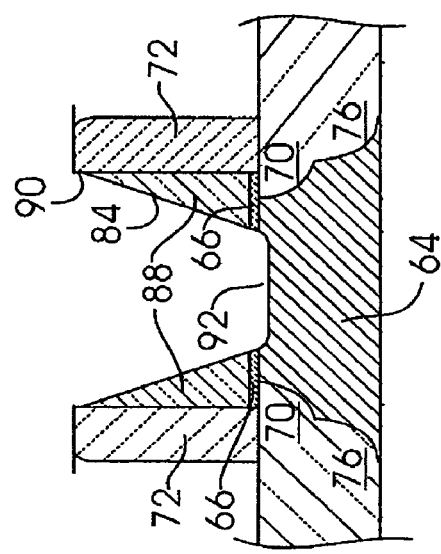
FIG. 3b illustrates an intermediate active gate region structure resulting after the polysilicon spacer etch after step 50.
Figure 3C:
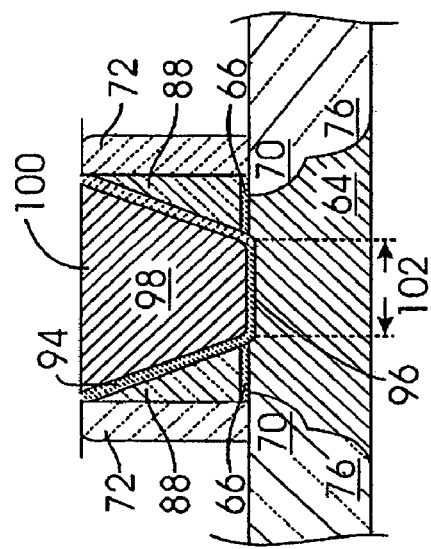
FIG. 3c illustrates the final active gate region structure following deposition and polishing of metal into the etched region after step 58.

FIG. 2 shows a process flow for the inventive process. Intermediate structures resulting at stages of the process are illustrated in FIGS. 3a–3c.

Steps 16–42 provide the formation of a conventional MOS SOI structure using techniques known in the art.

In step 16, a bulk substrate 60 is provided having a buried oxide layer 62 thereon, usually undoped SiO2 with thickness of approximately 50–60 nm, and a thin undoped SOI silicon layer 64 of approximately 5–20 nm atop the buried oxide layer 62.

In step 18, temporary gate dielectric 66 is grown and/or deposited using standard methods atop the SOI silicon layer 64, comprising silicon dioxide alone or in combination with other dielectric such as silicon nitride, with a total equivalent oxide thickness of 0.6–2.0 mm.

In step 20, approximately 75–100 nm of polysilicon 65 is deposited atop the temporary gate dielectric 66, then 20–36 nm of SiON 67 is deposited atop the polysilicon.

In step 22, the polysilicon/SiON layer is patterned and etched using known lithographic and etching techniques to provide a gate poly feature 68 with length of 40–75 nm.

In step 24, implantation of extension implanted regions 70 is performed. For p-channel devices, extension implantation may be 1–2e14/cm$^2$ BF2 at 10–15 keV. For n-channel devices, extension implantation may be 0.5–2 e14/cm$^2$ As at 3–5 keV.

In step 26, RTA anneal for 5–10 seconds at 900–950C is performed.

In step 28, 70–90 mm silicon nitride is deposited by standard deposition techniques.

In step 30, the nitride of step 28 is anisotropically etched using standard dielectric etch processes, leaving nitride spacers 72 on the polysilicon sidewalls 74. Exposed portions of the temporary gate dielectric 66 are removed during the nitride etch.

In step 32, implantation of source/drain regions 76 is performed. For n-channel devices, source/drain implantation may be 2–3e15/cm$^2$ P at 7–13 keV. For p-channel devices, source/drain implantation may be 2–3e15/cm$^2$ B at 1.5–3 keV. The gate poly 68 is also doped during the source/drain implantation step.

In step 34, RTA anneal for 5–10 seconds at 950–1025 C is performed.

In step 36, 20–25 nm silicon 78 is grown by a selective epi process.

In step 38, 10–12 nm cobalt is deposited.

In step 40, the wafer is annealed a 650–800 C for 15–60 seconds to convert the selective epi layer to cobalt silicide 80. The unreacted cobalt is removed by a standard wet strip process in step 41.

In step 42, 150–200 nm TEOS 82 is deposited and polished back to the top of the SiON layer 67, using standard deposition and CMP processes. FIG. 3a illustrates the intermediate structure resulting following process step 42.

Steps 44–50 are an embodiment of an inventive process flow which provides for the formation of tapered doped poly spacers inside the gate opening.

In step 44, the wafer is installed in an oxide RIE machine such as the Applied Materials MxP+, and standard selective RIE etch is performed to remove the SiON layer 67. The high selectivity of the etch insures minimal loss of TEOS 82 or nitride 72, and acceptable loss of the polysilicon 65 (which is non-critical).

In step 46, the wafer is installed in a poly RIE machine such as the Applied Materials DPS system, and RIE poly etch is performed using a mixture of Cl$_2$ and HBr with He and oxygen, which has a very high selectivity of poly etch rate to oxide etch rate (on the order of 40–50:1), etching through the gate poly layer 65 and stopping on the temporary gate dielectric 66. The high selectivity allows for approximately 100% overetch. This etching step includes a) adjusting the Cl$_2$/HBr ratio and b) adjusting the temperature of the wafer chuck to provide the desired amount of taper of the etch walls 84. Temperatures can range between 30 and 70 C, and Cl$_2$/HBr ratio can range between 0.5 and 1.5. The amount of taper is chosen to leave a base of approximately 10–20 nm of poly at the bottom 86 of each poly spacer 88. This corresponds to a sidewall angle of approximately 75–85 degrees from horizontal for poly thickness of 75 nm, assuming the poly spacer thickness of zero at the top 90 of the spacers 88. The aforementioned etch chemistry, while known in the art, is not generally applied to the etching of polysilicon lines, due to the tapered sidewalls which result. However, according to our invention, taper of 75–85 degrees is desirable and therefore the selected etch chemistry is suitable.

In step 48, standard wet etching is performed to remove the remaining exposed temporary gate dielectric.

In step 50, wet etch in a mixture of NH$_4$OH and H$_2$O$_2$ is performed to remove approximately 30 Angstroms of silicon below the etched region 92, to provide a thinner channel which yields better short-channel control. FIG. 3b illustrates the intermediate structure of the active gate region, resulting following process steps 44–50.

Steps 52–58 are further embodiments of the inventive process flow which provides for the formation of final gate dielectric and metal inside the gate opening.

In step 52, final gate dielectric 94, comprising by way of example 6 Angstroms silicon dioxide followed by 10 Angstroms silicon nitride, is deposited at low temperature, rather than grown by thermal oxidation. This is necessitated by the inability of the silicide 80 to withstand the high temperatures utilized in an oxidation furnace. Low temperature dielectric deposition yielding suitable quality gate dielectric has been successfully performed in the Remote Plasma Processing Tool from Applied Materials, at a temperature of approximately 300 C.

In step 54, the wafer is annealed at the highest acceptable temperature, generally about 800C for approximately 1–3 minutes to produce a high quality dielectric 94 and dielectric-silicon interface 96. The presence of the dielectric 94 on poly spacer sidewalls 84 prevents intermixing of the metal electrode and the poly spacers, thereby providing a well-defined gate work function.

In step 56, metal 98 is deposited into the etched region 100, atop the gate dielectric 94. CVD deposition of mid-gap metals such as TiN or W may be utilized if a single metal deposition is used for both n- and p-channel devices. Alternatively, the metal deposition process and subsequent polish step may be repeated separately for n- and p-channel devices while masking the other device types, if the metal is to be separately optimized for n- and p-channel devices. This alternative increases process complexity, but provides for improved device characteristics. In step 58, CMP is performed to polish away the residual metal 98 from the top of the TEOS layer 82. In step 60, a short wet etch removes a small amount of gate dielectric 94 at the top of the poly spacer sidewalls 84, extending less than halfway down the sidewalls, to assure that subsequent conducting contacts reach the metal electrode and both poly sidewall spacers when applying gate bias.

FIG. 3c illustrates the final structure of the active gate region. Metal gate 98 is separated from silicon 64 by gate dielectric 94. Two sets of gate sidewall spacers include tapered doped poly spacers 88 and dielectric spacers 72. Channel length 102 is determined by the width of metal 98 at its bottom.

Our inventive method, including formation of an MOS structure having a doped polysilicon gate, then etching the poly to leave tapered poly spacers and depositing gate dielectric and metal into the etched region, provides channel length 102 as small as 20–35 nm according to the poly spacer dimensions outlined above. CVD metal deposition is known to be able to fill such a small gap, and the tapered sidewalls increase the effectiveness of the metal fill. The gate work function is determined by the bottom 25 Angstroms of metal, so the deposited metal must be of high quality for at least that thickness. In contrast, using state of the art patterning and etching techniques for metal lines, critical dimensions and channel lengths are typically 90 nm or greater. Additionally, the metal configuration using our process, whereby the metal is wider at the top, lowers gate resistance while maintaining short channel length.

Figure 4:
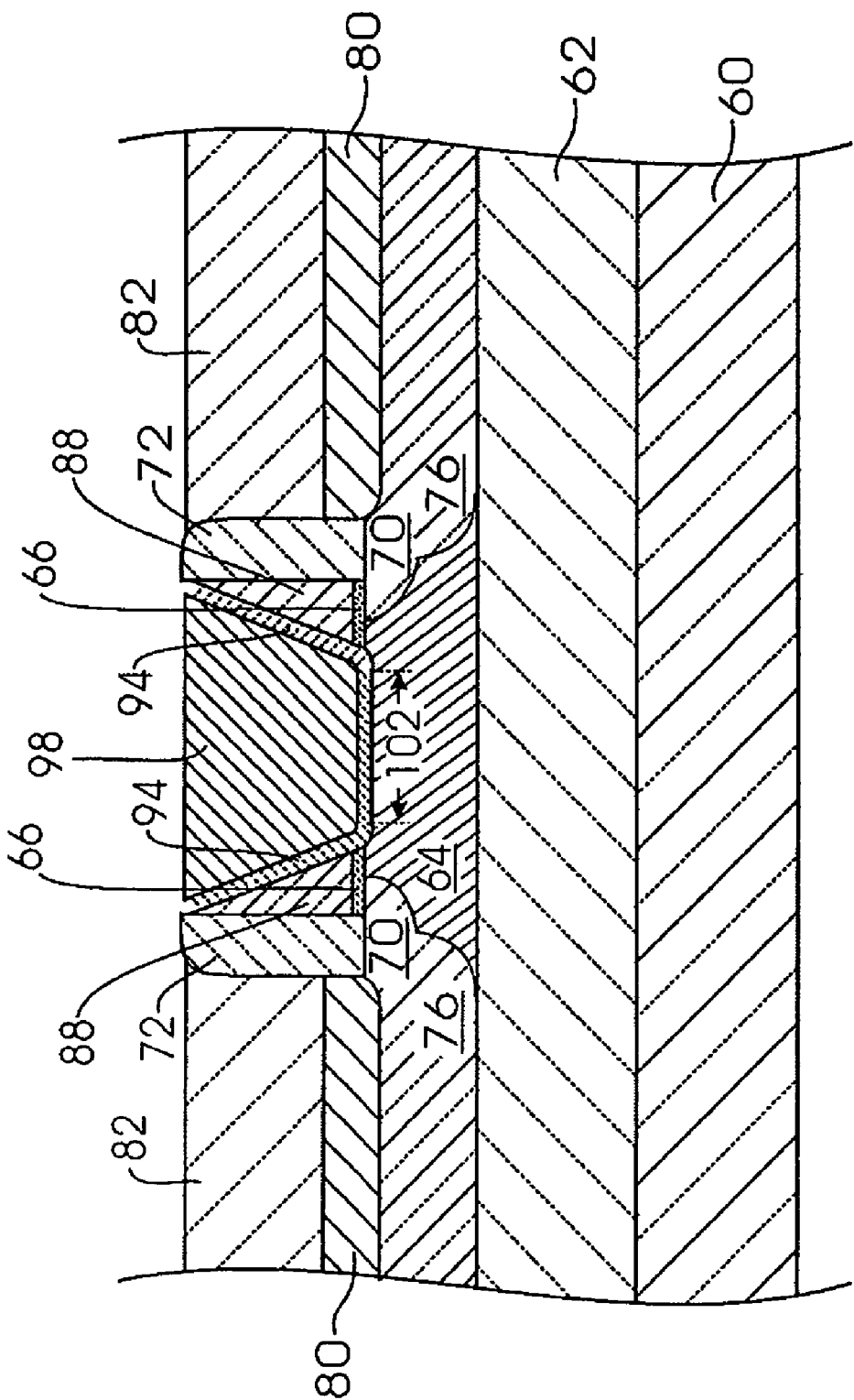
FIG. 4 illustrates an embodiment of a completed FDSOI device active region made by our process.

Standard contact and metallization processes follow the inventive formation of the gate region of the device. FIG. 4 illustrates a completed FDSOI device active region made by our process. Metal gate 98 which is wider at the top defines channel length 102 less than 50 nm. Double sidewall spacers include tapered doped poly spacers 88 and nitride spacers 72. Deposited gate dielectric 94 separates metal gate 98 from SOI silicon 64.

We have provided an inventive method for forming a Fully Depleted Silicon-On-Insulator device structure with a thin SOI silicon layer and a channel length less than 50 nm, having inner polysilicon spacers and outer dielectric spacers, which maintains excellent $I_{off}$ DC characteristics without degrading device AC speed and characteristics.

Device simulations using the Medici simulation program by Avanti show that the DC Ioff characteristics are comparable to those achieved with only polysilicon spacers; the Ion characteristics are within 2–3% of those achieved with only polysilicon spacers. The AC characteristics, specifically the inverter ring oscillator stage delay, are significantly improved compared to a device having only polysilicon spacers. The AC characteristics are within 10% of the values achieved with devices having only silicon nitride spacers, but with much improved short channel control.

It is not intended that the invention be restricted to the exact embodiments described herein. For example, the processing details, including temperatures, times, implant energies and doses, and exact metal and dielectric materials used, may be altered without departing from the inventive concept. Alternative metals for n-channel devices include: PVD or CVD Al, electroplated Co or its alloys (CoWP, CoWB), and Cr and its alloys. Alternative metals for p-channel devices include: CVD or electroplated Ni, electroplated Pd or its alloys (SnPd), or Atomic Layer Deposited $RuO_2$. Alternative metals for mid-gap electrodes include: electroplated Cu, Ag, and Ir and their alloys. The scope of the invention should be construed in view of the claims.

We claim:

1. An FDSOI device comprising:
    a bulk semiconductor substrate having a top surface, a buried oxide layer atop said top surface of said substrate and a thin undoped SOI silicon layer atop said buried oxide layer thereon, said buried oxide layer having a thickness in the range between 50 and 60 nm, and said SOI silicon layer having a top surface and having a thickness in the range between 5 and 20 nm;
    a doped gate poly feature on said top surface of said SOI silicon layer, said doped gate poly feature having a length in the range between 40 and 75 nm, said doped gate poly feature having outer sidewalls, said doped gate tapered polysilicon features each having a base and a top, each said base being wider than said top, each said tapered polysilicon feature having a tapered surface connecting said poly feature comprising a first and a second tapered polysilicon feature having a gap therebetween, said first and second base to said top opposite said outer sidewalls, said tapered surfaces being at an angle with respect to said top surface of said bulk substrate, said gap having a bottom edge, said bottom edge of said gap being a portion of said top surface of said SOI silicon layer and said bottom edge of said gap having a length;
    said doped gate poly feature has a pair of extension implanted regions in said SOI silicon layer, said extension implanted regions extending under said first and second tapered polysilicon features;
    said doped gate poly feature has a pair of dielectric spacers abutting said gate poly feature outer sidewalls, said dielectric spacers having a top and a bottom; and
    source/drain implanted regions in said SOI silicon layer, said source/drain implanted regions extending under said dielectric spacers.

2. The device of claim 1 further comprising:
    a layer of cobalt silicide atop a portion of said SOI silicon layer not under said gate poly feature or said dielectric spacers; and
    a TEOS layer atop said cobalt silicide layer, said TEOS layer having a thickness in the range between 150 and 200 nm, said TEOS layer having a top surface, said top surface of said TEOS layer being substantially even with said top of said dielectric spacers.

3. A bulk semiconductor substrate having a top surface, a buried oxide layer atop said top surface of said substrate and an undoped SOI silicon layer atop said buried oxide layer thereon said buried oxide layer having a thickness in the range between 30 and 80 nm, and said SOI silicon layer having a top surface and having a thickness in the range between 2 and 40 nm; said SOI silicon layer including an SOI structure, said SOI structure comprising:
    a MOS structure including a ploysilicon gate;
    dielectric spacers abutting sidewalls of said ploysilicon gate;
    tapered poly spacers separated by a gap, wherein said tapered poly spacers are formed by taper-etching said ploysilicon gate;
    a gate dielectric in said gap; and
    a metal on said gate dielectric and in said gap.

4. The SOI structure of claim 3, wherein said metal forms a metal gate, and wherein said metal gate is less than 50 nm in length.

5. The SOI structure of claim 3, wherein said taper-etching uses Reactive Ion Etching utilizing a mixture of HBr and $Cl_2$ etch gases.

6. The SOI structure of claim 3, said taper-etching is achieved by adjusting a temperature to be in a range of 30° C. to 70° C., adjusting $Cl_2$/HBr gas flow ratio to be in a range of 0.5 to 1.5, and adjusting a taper angle to be in a range of 75° to 85°.

7. The SOI structure of claim 6, wherein said metal forms a metal gate, and wherein said metal gate is less than 50 nm in length.

* * * * *